United States Patent [19]

Citta et al.

[11] Patent Number: 5,565,932
[45] Date of Patent: Oct. 15, 1996

[54] AGC SYSTEM WITH PILOT USING DIGITAL DATA REFERENCE

[75] Inventors: Richard W. Citta, Oak Park; Dennis M. Mutzabaugh, Mount Prospect; Gary J. Sgrignoli, Mt. Prospect, all of Ill.

[73] Assignee: Zenith Electronics Corp., Glenview, Ill.

[21] Appl. No.: 335,603

[22] Filed: Nov. 8, 1994

[51] Int. Cl.⁶ .............................. H04N 5/52; H04N 5/455
[52] U.S. Cl. ............................................ 348/678; 348/726
[58] Field of Search ................................ 348/471, 495, 348/528, 537, 678, 682, 726, 727, 638, 639, 641, 21; H04N 5/52, 5/455

[56] References Cited

U.S. PATENT DOCUMENTS 5,410,368  4/1995  Krishnamurthy et al. .............. 348/726
5,416,524  5/1995  Citta et al. ................................ 348/471

Primary Examiner—Victor R. Kostak
Assistant Examiner—John W. Miller

[57] ABSTRACT

An AGC circuit for a digital receiver that receives a digital television signal or the like, including a pilot, and formatted in a plurality of repetitive data segments, each data segment comprising a fixed number of multilevel symbols occurring at a constant symbol rate. The multilevel symbols are converted to corresponding digital values and the pilot (represented by a DC offset) is removed from the digital values. Every fourth symbol is sampled and the samples are accumulated and divided to derive an average symbol value. The average symbol value is compared with a reference average symbol value and the result of the comparison is an AGC potential that controls the tuner and IF gains. A cable/terrestrial input alters the sampling for cable signals to compensate for high level sweep testing in cable systems.

22 Claims, 2 Drawing Sheets

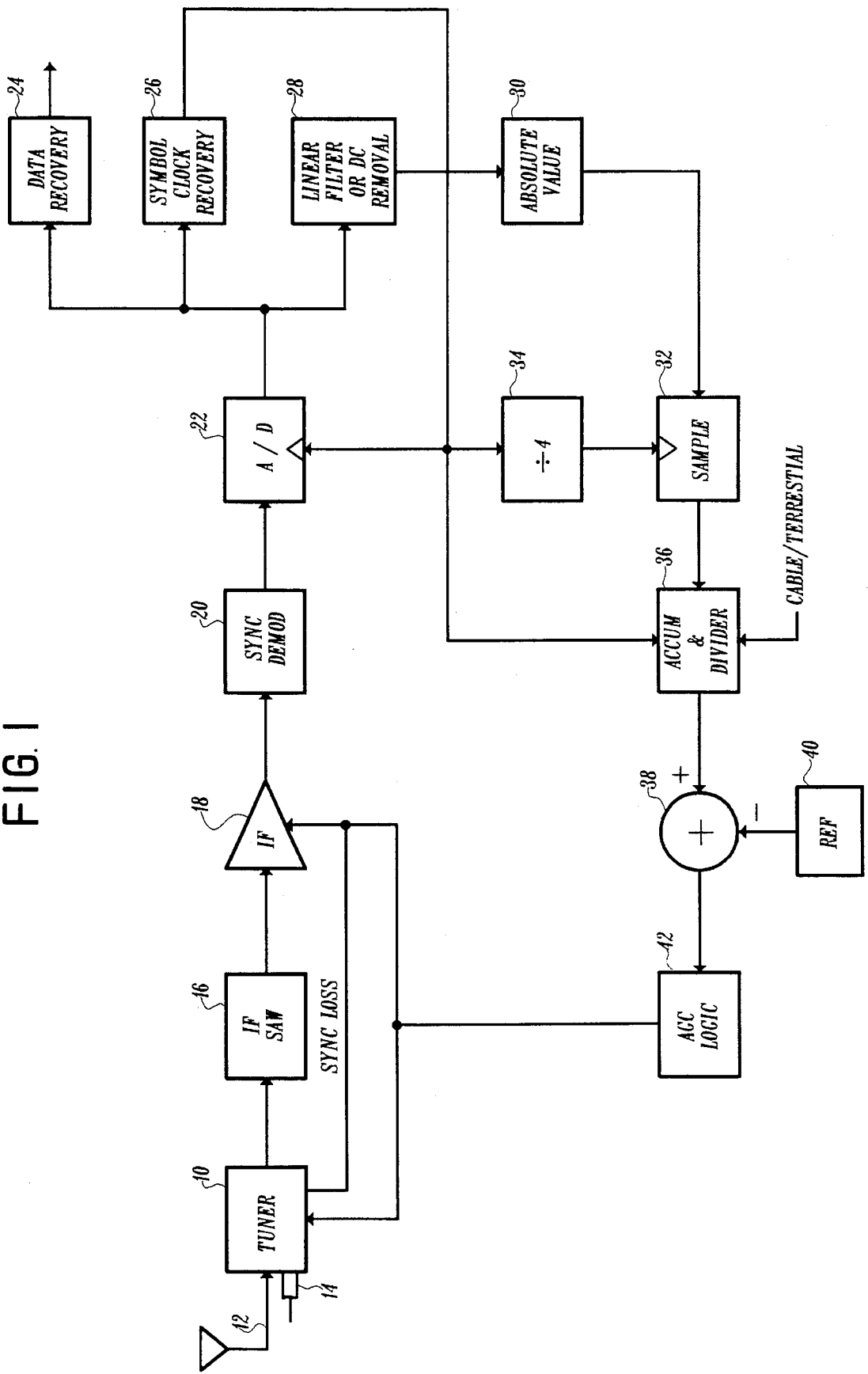

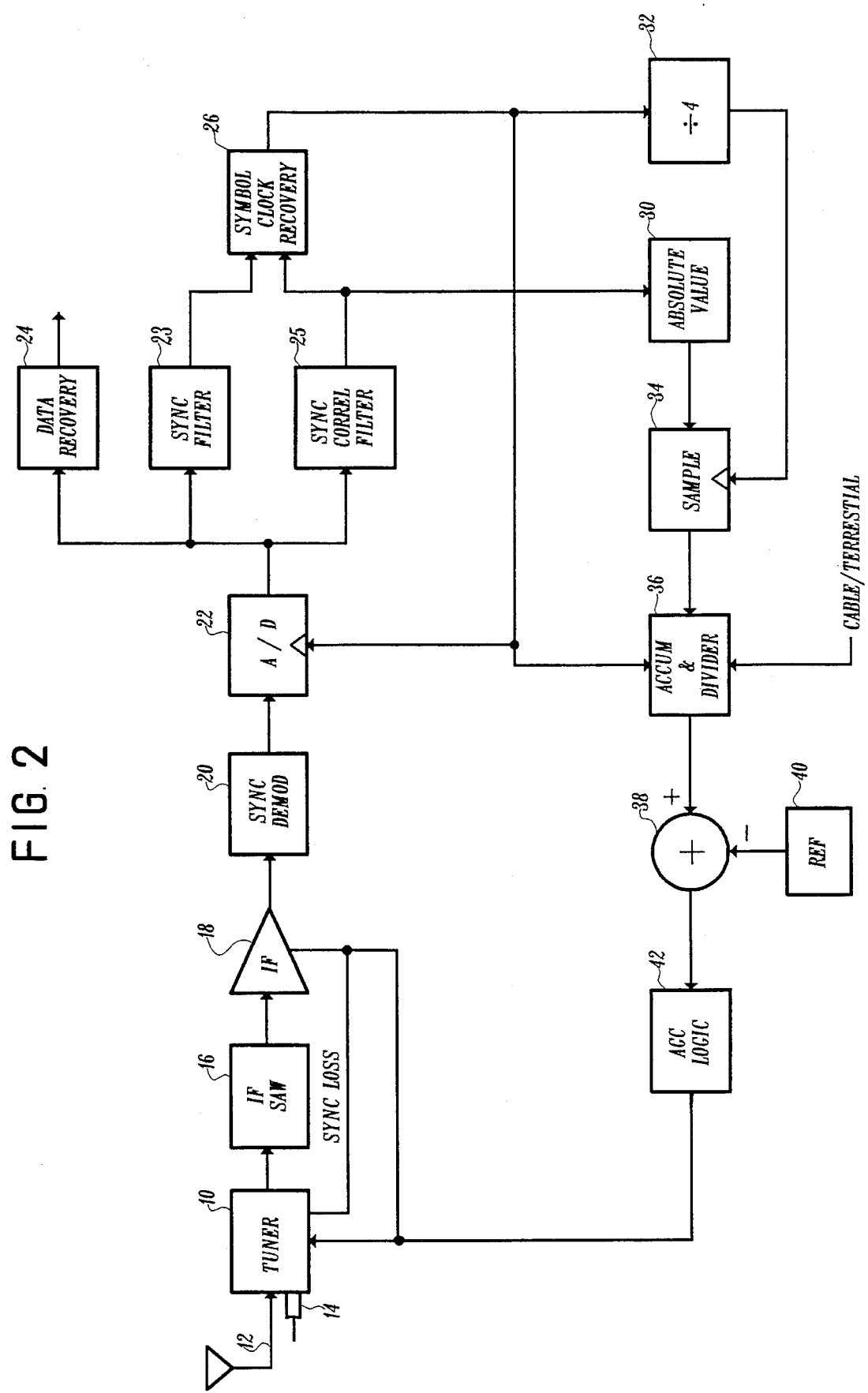

AGC SYSTEM WITH PILOT USING DIGITAL DATA REFERENCE

CROSS REFERENCE TO RELATED APPLICATIONS

This application is related to application Ser. No. 08/175,333 entitled CARRIER ACQUISITION SYSTEM FOR A SYNCHRONOUS DEMODULATOR and application Ser. No. 08/174,867 entitled POLARITY SELECTION CIRCUIT FOR BI-PHASE STABLE FPLL, both filed on Dec. 29, 1993 and both assigned to Zenith Electronics Corporation.

BACKGROUND OF THE INVENTION AND PRIOR ART

The present invention relates generally to digital data receivers and particularly concerns an AGC system for a digital television signal receiver.

A number of systems have recently been proposed for transmitting and receiving television signals in digital form. The television signal may comprise, for example, a compressed wide band HDTV signal or one or more compressed NTSC signals. The two most widely promoted modulation techniques for effecting such transmission are quadrature amplitude modulation (QAM) and vestigial side band modulation (VSB). U.S. Pat. No. 5,087,975 discloses a VSB system for transmitting a television signal in the form of successive M level symbols over a standard 6 MHz television channel, with a relatively small, that is low power level, pilot at the lower edge of the channel. While the number of levels M, (the VSB mode that characterizes the symbol levels) may vary, the symbol rate is preferably fixed, such as at a rate of 684H (about 10.76 megasymbols per second) where H is the NTSC horizontal scanning frequency. The number of symbol levels used in any particular arrangement is largely a function of the signal-to-noise ratio that characterizes the transmission medium with a smaller number of symbol levels being used in situations where the signal-to-noise ratio is low, i.e. in noisy environments. For a cable system that provides a relatively benign environment, a system accommodating symbol levels of 16, 8, 4 and 2 provides flexibility to satisfy most conditions. For terrestrial or over the air broadcasts where the environment is less benign, a VSB mode of 8 (i.e. 8-level data symbols) is appropriate. It will be appreciated that lower values of M can provide improved signal-to-noise performance at the expense of a reduced transmission bit rate. For example, assuming a rate of 10.76 megasymbols per second, a two level VSB signal (one bit per symbol) provides a transmission bit rate of 10.76 megabits per second whereas a four level VSB signal (two bits per symbol) provides a transmission bit rate of 21.52 megabits per second.

Proper operation of a digital receiver, such as a television receiver, requires the received carrier signal to be acquired relatively rapidly and the gain of the RF and IF sections of the receiver to be appropriately adjusted. Carrier acquisition in QAM receivers is relatively difficult because of the absence of any sort of pilot. While the use of a pilot in the above-mentioned VSB system greatly facilitates carrier acquisition, difficulties are nevertheless encountered due to the relatively low level of the pilot and the limited pull in range of synchronous demodulators that are used in these receivers. The above-mentioned copending related applications are concerned with enhancing the pull in of the FPLL and dealing with the biphase stability of the frequency and phase locked loop in the synchronous demodulator. This invention is directed to a novel AGC system for use in a digital television receiver where the signal includes a pilot.

OBJECTS OF THE INVENTION

It is a basic object of the invention to provide a novel AGC system for a digital data receiver.

It is another object of the invention to provide an automatic gain control system for a digital data receiver that samples the levels of the data symbols.

BRIEF DESCRIPTION OF THE DRAWING

These and other objects and advantages of the invention will be apparent upon reading the following description in conjunction with the drawings, in which:

FIG. 1 is a partial block diagram of a television receiver constructed in accordance with the invention; and FIG. 2 is a partial diagram of another version of a television receiver constructed in accordance with the invention.

DESCRIPTION OF THE PREFERRED EMBODIMENT

As mentioned, the transmitted VSB signal preferably includes a small pilot at the lower boundary of the 6 MHz television channel and may comprise 2, 4, 8 or 16 level symbols (or a combination thereof). The symbols are preferably arranged in successive data fields, each field comprising 313 data segments. Each data segment comprises 832 symbols including four two level symbols representing data segment sync and the first data segment of each field comprising a sequence of two level symbols representing a frame synchronization code. In the preferred embodiment, the data symbols are 8 level, although symbols having different levels may also be used in accordance with the invention.

The pilot may be conveniently developed in the transmitter by introducing an offset (i.e., a constant DC level) to the symbol values. In the receiver, the offset generates a constant DC which is used for carrier recovery.

Referring to FIG. 1, the received RF signals are converted to IF signals by a tuner 10. The RF signals may be received via an antenna 12 for terrestrial signals or via a cable input 14 for cable signals. It will be appreciated that the various elements of the receiver are generally under microprocessor control, but such is not illustrated for the sake of simplicity. The IF output of tuner 10 is supplied to an IF SAW filter 16 and thence to an IF amplifier 18. The output of IF amplifier 18 is supplied to a synchronous demodulator 20 that in turn feeds an analog to digital (A/D) converter 22 in which the amplitudes of the received symbols are converted to corresponding digital values. A/D 22 supplies a data recovery circuit 24 where the data symbols are recovered, a symbol clock recovery circuit 26, where timing signals are developed based upon the synchronization information and a linear filter (such as a post comb filter) or DC removal circuit 28 where the DC is removed. The DC, it will be recalled, represents the pilot and uniformly affects all symbol values in the form of an offset. The output of the DC removal circuit 28 is supplied to an absolute value circuit 30 which provides an output representing the magnitude of the symbols. Absolute value circuit 30 is used to rectify the values of the received symbols since they may assume negative as well as positive levels. For example, the levels for VSB mode 8 may comprise −7, −5, −3, −1, +1, +3, +5 and +7. The absolute value circuit 30 supplies its output to a sampler 32 which is controlled by a divide-by-four counter 34. Symbol clock recovery circuit 26 provides a timing signal to A/D converter 22, to divide-by-four counter 34 and to an accumulator and divider circuit 36 which is provided with the output of the sampling circuit 32. The timing signal preferably comprises a clock signal at the symbol rate. A cable/terrestrial control input is provided to accumulator and divider circuit 36 for purposes to be described. The output of the accumulator and divider circuit 36 comprises the average value of the sampled data symbols over a predetermined time interval and is supplied to the positive input of an adder 38. The negative input of adder 38 is supplied from a reference source 40 which applies a reference signal representing the known average value of the symbols. This is based upon the symbols being random and a knowledge of the symbol levels, i.e. the VSB mode. For VSB=8, with the rectified symbol levels being +1, +3, +5, +7 (and the pilot having been removed by circuit 28), the average symbol value =4. The reference average symbol value is subtracted from the determined average symbol value and the difference represents how much above or below the reference the actual data levels are. The output or result of the comparison is supplied to an AGC logic circuit 42 which in turn controls the AGC of tuner 10 and IF amplifier 18.

During initial operation, the AGC logic circuit 42 operates the tuner and IF circuits at maximum gain. This is to assist in carrier acquisition because of the low level pilot that is involved in the signal. The sampling circuit 32 samples every Nth symbol and supplies that value to accumulator and divider circuit 36. It will be recalled that the symbol values have been rectified by absolute value circuit 30 and that the pilot (DC offset) has been removed by circuit 28. Circuit 36 accumulates the symbol values for a fixed number of sampled symbols Y and divides that amount by fixed number Y to yield a derived average value of a received data symbol. This average data symbol value is compared with the reference average value and the AGC is adjusted to reduce the gain of the tuner and IF from maximum based upon this comparison. In practice, N equals 4 and the number of symbols that are accumulated (Y) covers seven data segments of symbols for a terrestrial signal. For a cable signal that may be subject to a high level sweep signal for testing purposes, the sample is taken over a different period to minimize the effects of such a high level sweep signal. Consequently, for cable inputs, the accumulate and divide ratios will be different and this is controlled by the cable/terrestrial control input to accumulator and divider circuit 36.

Circuit 28 in FIG. 1 is identified as either a linear filter or a DC removal circuit. The main function of circuit 28 is DC removal, i.e. to eliminate the effects of the pilot on the values of the symbols that are determined. In U.S. Pat. Nos. 5,086,340 and 5,087,975, the effects of operating a digital television receiver in the vicinity of a co-channel NTSC signal are described. In particular, a linear filter (post comb circuit) is selectively inserted in the received data stream to eliminate most of the interference from the NTSC co-channel signal. The linear filter has the effect of also removing any DC and consequently the present invention may conveniently provide for recovering the digital data symbols from the output of a linear filter which would eliminate the need for a separate DC removal circuit.

In FIG. 2, the circuit arrangement of FIG. 1 is substantially replicated with the exception of the addition of a sync filter 23 and a sync correlation filter 25 between A/D 22 and symbol clock recovery circuit 26. In copending Ser. No. 894,388, filed Jun. 5, 1992, the arrangement of recovering the sync by virtue of a pair of filters having appropriately tailored characteristics so that one filter produces a discriminator characteristic curve in response to the sync character in the transmitted signal and the other filter produces a peak characteristic in response to the sync character is described. In that arrangement, the sync correlation filter 25 has the characteristic of also eliminating DC. Hence, the pilot signal offset would be automatically compensated for with that filter arrangement. In this arrangement (FIG. 2), the absolute value circuit 30 is connected to the output of sync correlation filter 25. In other respects, FIG. 2 is the same as FIG. 1 as indicated by the like reference characters denoting similar elements. Operation of the circuit arrangement of FIG. 2 is identical to that of FIG. 1.

What has been described is a novel technique for a digital television signal that includes a pilot. It is recognized that numerous changes in the described embodiment of the invention will be apparent to those skilled in the art without departing from its true spirit and scope. The invention is to be limited only as defined in the claims.

What is claimed is:

1. A method of operating a digital data receiver for receiving a digital signal including a pilot and a plurality of multilevel data symbols occurring at a constant symbol rate comprising:

converting received data symbols to corresponding digital values;

eliminating effects of said pilot on said digital values;

sampling said data symbols for a predetermined time for determining an average data symbol value;

comparing the determined average data symbol value with a reference average data symbol value; and adjusting the gain of said receiver as a function of the comparison.

2. The method of claim 1 wherein said sampling is performed every N data symbols and wherein said averaging is performed over Y data symbols.

3. The receiver of claim 2 wherein said digital signal is formatted in repetitive segments of a fixed number of symbols and wherein Y covers a number of said segments.

4. The method of claim 3 wherein said receiver has a cable signal input and a terrestrial signal input and wherein Y is different for received cable signals.

5. The method of claim 3 wherein said pilot is represented by a DC component and wherein said eliminating removes said DC component.

6. The method of claim 3 wherein said receiver includes a linear filter for removing co-channel interference, said linear filter having a zero DC response, and wherein said eliminating comprises;

sampling said symbols from said linear filter.

7. The method of claim 1 including rectifying said digital values.

8. A method of operating a digital data receiver receiving a digital signal including a pilot and formatted in repetitive data segments, each including a fixed number of multilevel data symbols occurring at a constant symbol rate and including a DC component representing a pilot signal comprising:

converting received data symbols to corresponding digital values;

removing said DC component from said digital values;

sampling a group of Y data symbols every N data symbols for determining an average symbol value;

comparing the determined average data symbol value with a reference average data symbol value; and adjusting the gain of said receiver as a function of the comparison.

9. The method of claim 8 wherein said receiver has a cable signal input and a terrestrial signal input and wherein Y is different for received cable signals.

10. The method of claim 8 wherein said receiver includes a linear filter for removing co-channel interference, said linear filter having a zero response at DC and wherein said DC component removing comprises:

sampling said symbols from said linear filter.

11. The method of claim 8 including rectifying said digital values.

12. An AGC circuit for a data receiver that receives a digital television signal including a pilot and a plurality of multilevel data symbols occurring at a constant symbol rate comprising:

means for converting said received data symbols to digital values;

means for removing the effects of said pilot on said digital values;

means for sampling said data symbols;

means for determining an average received data symbol value for said received symbols by operating said sampling means for a predetermined time;

means for comparing said determined average data symbol value with a reference average data symbol value; and means for controlling the gain of said receiver based upon said comparison.

13. The AGC circuit of claim 12 further including means for rectifying said digital values.

14. The receiver of claim 12 further including:

a gain controllable stage;

means for operating said gain controllable stage at maximum during initial reception of a digital signal; and means for adjusting the gain of said gain controllable stage based upon said comparison.

15. The receiver of claim 14 wherein every N data symbols is sampled and wherein said predetermined time covers Y data symbols.

16. The receiver of claim 15 wherein said digital signal is formatted in repetitive segments of a fixed number of symbols and wherein Y covers a number of said segments.

17. The receiver of claim 15 wherein said receiver has a cable signal input and a terrestrial signal input and wherein Y is different for received cable signals.

18. The receiver of claim 15 wherein said pilot is represented by a DC component and wherein said removing means blocks said DC component.

19. The receiver of claim 15 wherein said receiver includes a linear filter for removing co-channel interference, said linear filter having a zero response at DC; and wherein said sampling means is coupled to receive the signal from said linear filter.

20. An AGC circuit for a data receiver that receives a digital signal formatted in repetitive data segments, each including a plurality of multilevel data symbols occurring at a constant symbol rate and having a DC offset representing a pilot comprising:

means for converting said received data symbols to digital values;

means for removing said DC offset from said digital values;

means for rectifying said digital values;

means for sampling every N data symbols;

means for determining an average received data symbol value for said received symbols by operating said sampling means over a predetermined time covering Y data symbols;

means for comparing said determined average data symbol value with a reference average data symbol value;

a gain controllable stage; and means for operating said gain controllable stage at maximum during initial receipt of said signal and for subsequently adjusting the gain of said gain controlled stage based upon said comparison.

21. The receiver of claim 20 wherein said receiver has a cable signal input and a terrestrial signal input and wherein Y is different for received cable signals.

22. The receiver of claim 20 wherein said receiver includes a linear filter that has a zero response at DC; and wherein said sampling means is coupled to receive the signal from said linear filter.

* * * * *